(12) United States Patent
Tsurumi

(10) Patent No.: US 7,557,660 B2
(45) Date of Patent: Jul. 7, 2009

(54) POWER AMPLIFICATION DEVICE

(75) Inventor: Hiroyuki Tsurumi, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 127 days.

(21) Appl. No.: 11/865,815

(22) Filed: Oct. 2, 2007

(65) Prior Publication Data
US 2009/0002072 A1    Jan. 1, 2009

(30) Foreign Application Priority Data
Oct. 2, 2006    (JP) .............................. 2006-271073

(51) Int. Cl.
*H02H 7/20* (2006.01)
(52) U.S. Cl. ...................................... 330/298; 330/251
(58) Field of Classification Search ................. 330/298, 330/207 P, 251, 207 A
See application file for complete search history.

(56) References Cited

U.S. PATENT DOCUMENTS 3,260,912 A * 7/1966 Gregory ..................... 318/257
4,414,514 A    11/1983 Seki et al.
7,068,095 B2 * 6/2006 Bernardon ...................... 330/9
7,230,485 B2 * 6/2007 De Cremoux et al. ........ 330/251

FOREIGN PATENT DOCUMENTS

| JP | 05-16691 | 4/1986 |
| JP | 05-235652 | 9/1993 |
| JP | 08-21855 | 1/1996 |

* cited by examiner

*Primary Examiner*—Henry K Choe
(74) *Attorney, Agent, or Firm*—Turocy & Watson, LLP

(57) ABSTRACT

A power amplification device includes a BTL amplification circuit including a first amplification circuit and a second amplification circuit, the first amplification circuit including a first output transistor, a first power detection circuit, a second output transistor, and a second power detection circuit, the second amplification circuit including a third output transistor, a third power detection circuit, a fourth output transistor, and a fourth power detection circuit, a first comparator which compares output values of the first and fourth power detection circuits, and a second comparator which compares output values of the second and third power detection circuits.

20 Claims, 9 Drawing Sheets

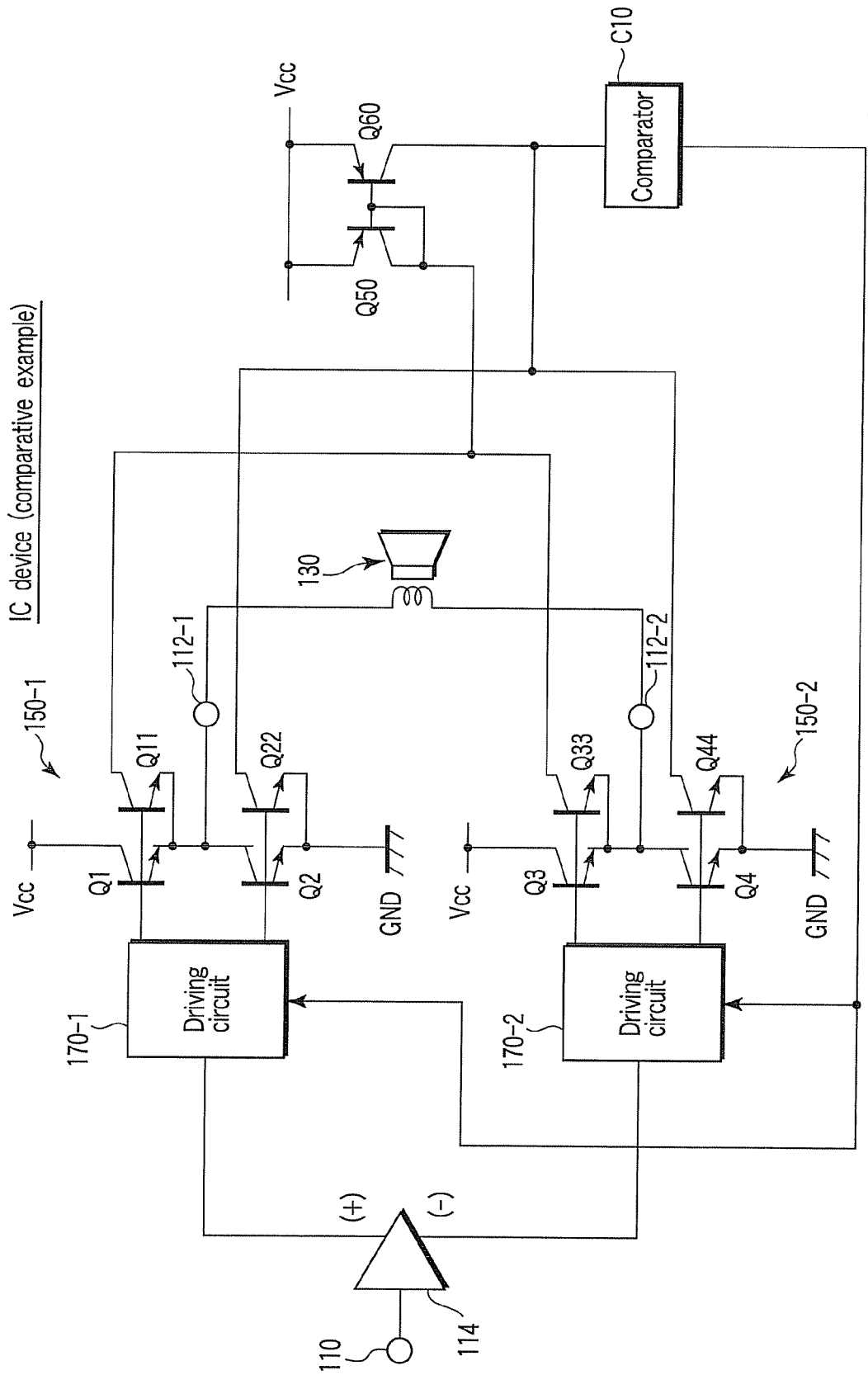
F I G. 13

POWER AMPLIFICATION DEVICE

CROSS-REFERENCE TO RELATED APPLICATIONS

This application is based upon and claims the benefit of priority from prior Japanese Patent Application No. 2006-271073, filed Oct. 2, 2006, the entire contents of which are incorporated herein by reference.

BACKGROUND OF THE INVENTION

1. Field of the Invention

The present invention relates to a power amplification device, and is applied, for example, to a power amplification device using a BTL (Bridge Tied Load) system.

2. Description of the Related Art

Conventionally, there is known a BTL-system amplification device as a power amplification device that is used as an amplifier for a speaker of vehicle-mounted stereo equipment or other audio equipment (e.g. Jpn. Pat. Appln. KOKAI Publication No. 5-235652). As disclosed in KOKAI Publication No. 5-235652, a BTL-system amplifier circuit device includes a pair of amplification circuits (2) and (3), and thus both the voltage and current, which can be output to a speaker (4), can be doubled formally, and a high maximum output power can advantageously be obtained.

In the BTL-system amplifier circuit device, if an output terminal, which is connected to the speaker (4), is short-circuited to a ground or a power supply side ("short-to-ground" or "short-to-supply"), the amplifier causes an excessive current to flow in order to drive a short-circuit resistor thereof. Consequently, an output transistor (2b, etc.) of the amplifier circuit (2), (3) may be destroyed by an overload. To avoid this, there is a need to provide some protection means.

Whether the output transistor (2b, etc.) is destroyed or not is determined by whether a heat amount [heat W=power P=current I×voltage V], which is produced in the output transistor (2b, etc.), exceeds a predetermined tolerance value or not.

In the conventional protection means, however, a current flowing in the output transistor (2b, etc.) is let to flow through a current-mirrored detection transistor (20b, etc.), and the current is directly monitored, detected and compared. Thus, the conventional protection means is configured to detect only the current I among the factors that determine the heat amount. This being the case, there is a tendency that only ambiguous determination can be made as to whether the output transistor is destroyed or not.

As a result, the conventional device cannot sufficiently enhance the precision of sensitivity setting of the protection circuit, and is disadvantageous in improving the detection/protection sensitivity of short-to-ground or short-to-supply, thereby to prevent destruction of the amplifier circuit.

On the other hand, in order to realize the setting for improving the detection sensitivity of short-to-ground or short-to-supply, a drivable BTL load (RL) has to be increased, although this is a demerit. In short, the magnitude of the drivable load is restricted, and this is disadvantageous in maximizing the performance for driving the BLT load. As described above, there is a certain trade-off between the detection sensitivity of short-to-ground or short-to-supply and the load driving performance.

BRIEF SUMMARY OF THE INVENTION

According to an aspect of the present invention, there is provided a power amplification device comprising: a BTL amplification circuit including a first amplification circuit and a second amplification circuit, the first amplification circuit including a first output transistor having a current path with one end connected to a first power supply and the other end connected to a first output terminal, a first power detection circuit which detects a power of the first output transistor, a second output transistor having a current path with one end connected to a second power supply and the other end connected to the first output terminal, and a second power detection circuit which detects a power of the second output transistor, the second amplification circuit including a third output transistor having a current path with one end connected to the first power supply and the other end connected to a second output terminal, a third power detection circuit which detects a power of the third output transistor, a fourth output transistor having a current path with one end connected to the second power supply and the other end connected to the second output terminal, and a fourth power detection circuit which detects a power of the fourth output transistor; a first comparator which compares output values of the first and fourth power detection circuits; and a second comparator which compares output values of the second and third power detection circuits.

According to another aspect of the present invention, there is provided a power amplification device comprising: a BTL amplification circuit including a first amplification circuit and a second amplification circuit, the first amplification circuit including a first output transistor having a current path with one end connected to a first power supply and the other end connected to a first output terminal, a first power detection circuit which detects a power of the first output transistor, a second output transistor having a current path with one end connected to a second power supply and the other end connected to the first output terminal, and a second power detection circuit which detects a power of the second output transistor, the second amplification circuit including a third output transistor having a current path with one end connected to the first power supply and the other end connected to a second output terminal, a third power detection circuit which detects a power of the third output transistor, a fourth output transistor having a current path with one end connected to the second power supply and the other end connected to the second output terminal, and a fourth power detection circuit which detects a power of the fourth output transistor; a first comparator for short-to-ground which compares output values of the first and fourth power detection circuits; a second comparator for short-to-ground which compares output values of the second and third power detection circuits; a first comparator for short-to-supply which compares output values of the first and fourth power detection circuits; and a second comparator for short-to-supply which compares output values of the second and third power detection circuits.

BRIEF DESCRIPTION OF THE SEVERAL VIEWS OF THE DRAWING

FIG. 13 shows a power amplification device according to a comparative example.

DETAILED DESCRIPTION OF THE INVENTION

Figure 1:
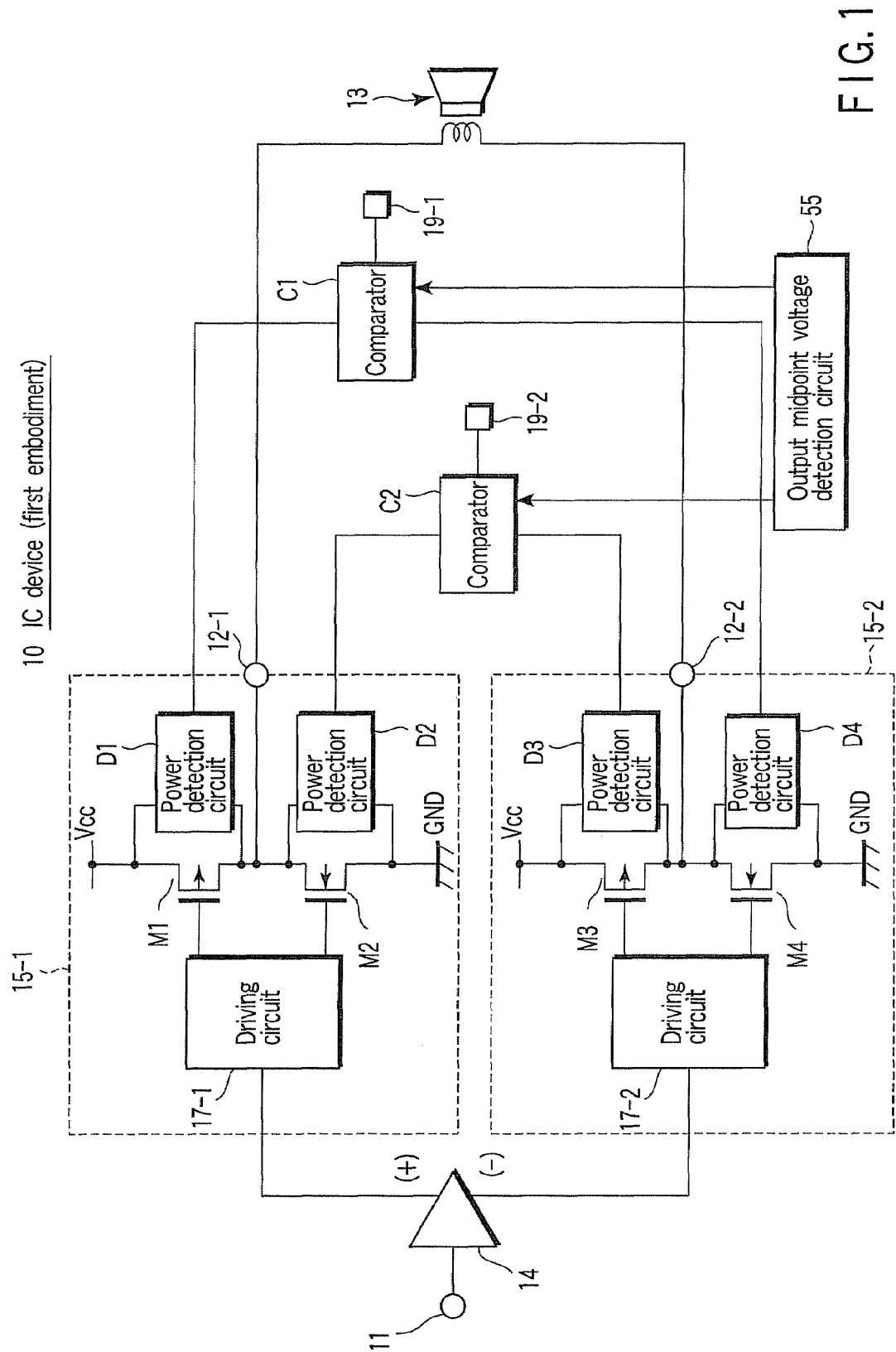
FIG. 1 is a block diagram showing a power amplification device according to a first embodiment of the present invention.

Embodiments of the present invention will now be described with reference to the accompanying drawings. In the description below, common parts are denoted by like reference numerals throughout the drawings.

First Embodiment

To begin with, referring to FIG. 1, a power amplification device according to a first embodiment of the present invention is described. FIG. 1 is a block diagram showing the power amplification device according to the first embodiment. In this embodiment, an amplification circuit device using a BTL (Bridge Tied Load) system is described by way of example.

As shown in FIG. 1, the power amplification device 10 includes a speaker 13, an amplifier 14, amplification circuits 15-1 and 15-2, comparators C1 and C2, and an output midpoint voltage detection circuit 55. The power amplification device 10 is configured to detect an overload state occurring at a time of short-to-ground or short-to-supply due to erroneous connection of an output terminal 12-1 or 12-2, while driving the speaker 13 by means of the BTL-system amplification circuits 15-1 and 15-2.

The amplifier 14 is configured to amplify an input signal from an input terminal 11, and to output the amplified signal to the amplification circuits 15-1 and 15-2 from a positive-phase side (+) output terminal and an opposite-phase side (−) output terminal.

The amplification circuit 15-1 includes a driving circuit 17-1 functioning as a push-pull output circuit, output transistors M1 and M2, and power detection circuits D1 and D2.

The driving circuit 17-1 is configured such that the input of the driving circuit 17-1 is connected to the positive-phase side (+) output of the amplifier 14, and the outputs of the driving circuit 17-1 are connected to the gates of the output transistors M1 and M2, thereby driving the output transistors M1 and M2.

The output transistor M1 is a PMOS transistor having a source connected to an internal power supply Vcc, and a drain connected to the output terminal 12-1.

The output transistor M2 is an NMOS transistor having a source connected to a ground power supply GND, and a drain connected to the output terminal 12-1.

The power detection circuit D1 is configured to detect an instantaneous loss power Pd1 of the output transistor M1 and to output a detection result to the comparator C1.

The power detection circuit D2 is configured to detect an instantaneous loss power Pd2 of the output transistor M2 and to output a detection result to the comparator C2.

The amplification circuit 15-2 includes a driving circuit 17-2 functioning as a push-pull output circuit, output transistors M3 and M4, and power detection circuits D3 and D4.

The driving circuit 17-2 is configured such that the input of the driving circuit 17-2 is connected to the opposite-phase side (−) output of the amplifier 14, and the outputs of the driving circuit 17-2 are connected to the gates of the output transistors M3 and M4, thereby driving the output transistors M3 and M4.

The output transistor M3 is a PMOS transistor having a source connected to the internal power supply Vcc, and a drain connected to the output terminal 12-2.

The output transistor M4 is an NMOS transistor having a source connected to the ground power supply GND, and a drain connected to the output terminal 12-2.

The power detection circuit D3 is configured to detect an instantaneous loss power Pd3 of the output transistor M3 and to output a detection result to the comparator C2.

The power detection circuit D4 is configured to detect an instantaneous loss power Pd4 of the output transistor M4 and to output a detection result to the comparator C1.

The comparator C1 is configured to compare the output values of the power detection circuits D1 and D4, to calculate a logical product between a logical value of the comparison result and an output logical value of the output midpoint voltage detection circuit 55, and to output the calculation result to a comparator output terminal 19-1.

The comparator C2 is configured to compare the output values of the power detection circuits D2 and D3, to calculate a logical product between a logical value of the comparison result and an output logical value of the output midpoint voltage detection circuit 55, and to output the calculation result to a comparator output terminal 19-2.

The output midpoint voltage detection circuit 55 is configured to detect output midpoint voltages of the output terminals 12-1 and 12-2, and to output the detected values to the comparators C1 and C2.

The output midpoint voltage, in this context, is defined as a direct current (DC) voltage of the output terminal 12-1, 12-2 at a time of a zero-signal state in which no signal is input to the input terminal 11. In the description of this embodiment, it is assumed that the output midpoint voltage is Vcc/2.

Figure 2:
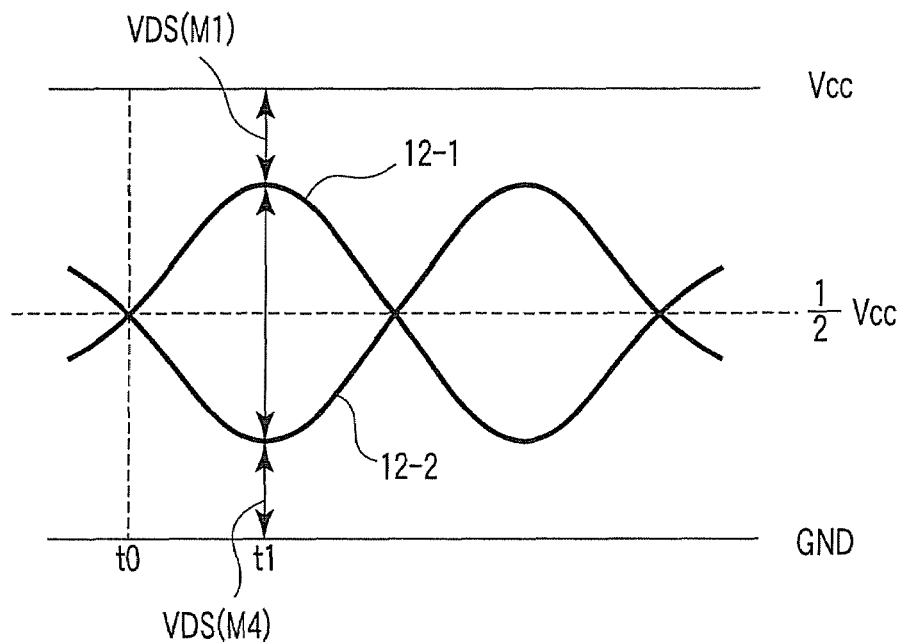
FIG. 2 is a view for explaining how to detect an output midpoint voltage (the case of Vcc/2) in the first embodiment.

For example, as shown in FIG. 2, when the output midpoint voltage (Vcc/2) of the output terminal 12-1, 12-2 is to be detected, the output midpoint voltage detection circuit 55 detects an output voltage 12-1, 12-2 at a time point t0. The output midpoint voltage detection circuit 55 monitors to ensure that the midpoint voltage does not greatly deviate from a predetermined Vcc/2, and outputs the detection result to an AND circuit 25 (to be described later) in the comparator C1, C2.

Figure 5:
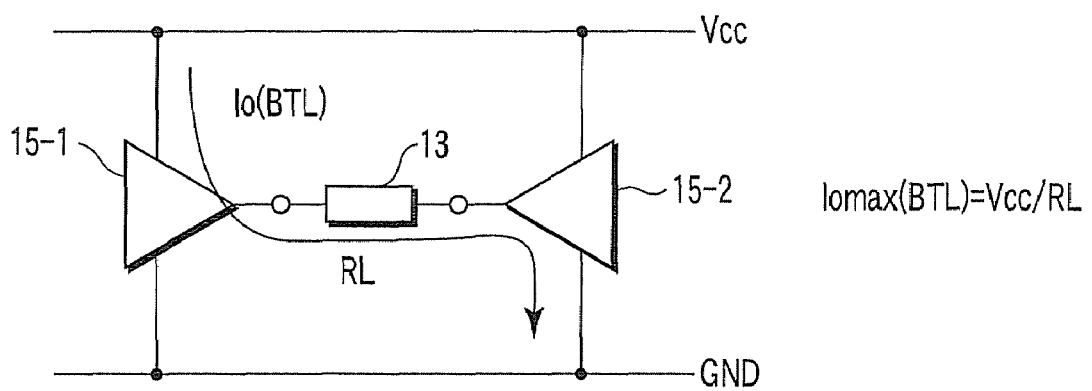
FIG. 5 illustrates a BTL load driving state of the power amplification device according to the first embodiment.

If the output midpoint voltage at time point t0 is Vcc/2, voltages VDS(M1) and VDS(M4) of the output transistors M1 and M4 at the time of the output of the BTL signal at time point t1 are exactly equal. In this case, at the time of the BLT load driving as shown in FIG. 5, the instantaneous loss power occurring in the transistor M1 is equal to the instantaneous loss power occurring in the transistor M4. In this embodiment, short-to-ground or short-to-supply is detected when imbalance occurs between the instantaneous loss power occurring in the transistor M1 and the instantaneous loss power occurring in the transistor M4. Thus, by monitoring the output midpoint voltage, the detection of the erroneous connection state can more exactly be performed.

Figure 3:
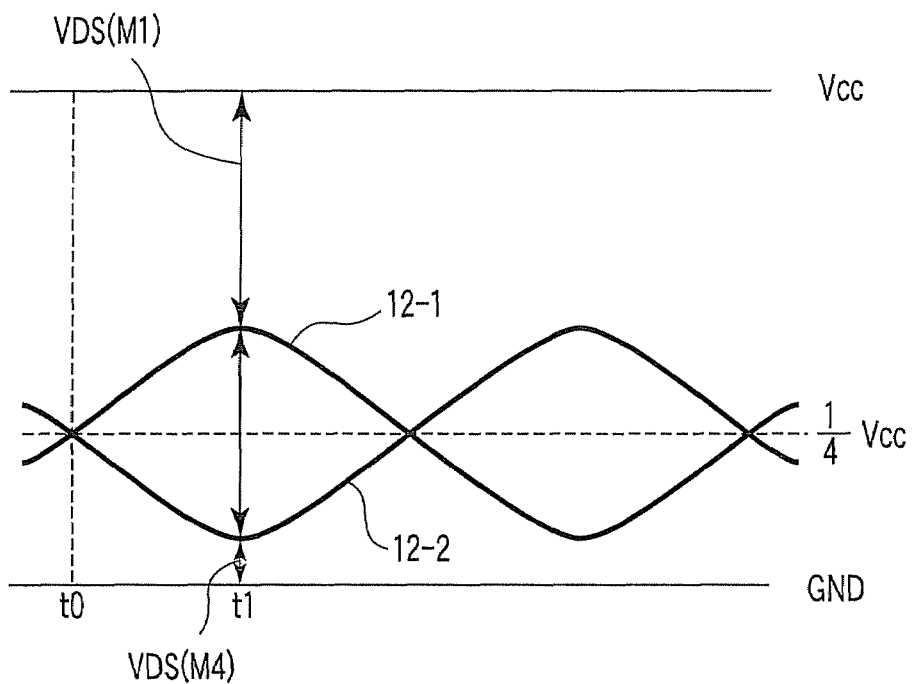
FIG. 3 is a view for explaining how to detect an output midpoint voltage (the case of Vcc/4) in the first embodiment.

The output midpoint voltage is not limited to Vcc/2, which has been described above. For example, as shown in FIG. 3, the output midpoint voltage may be set at Vcc/4. In this case, the output midpoint voltage detection circuit 55 detects an output voltage 12-1, 12-2 at a time point t0. The output midpoint voltage detection circuit 55 monitors to ensure that the midpoint voltage does not greatly deviate from a predetermined Vcc/4, and outputs the detection result to the AND circuit 25 (to be described later) in the comparator C1, C2.

<Driving Operation (Short-to-Ground State)>

Next, the driving operation in the short-to-ground state in this embodiment is described with reference to FIG. 4.

Figure 4:
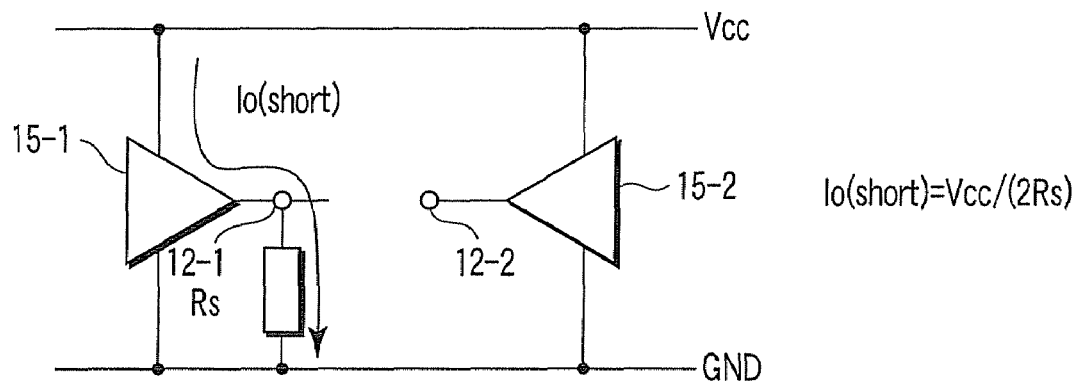
FIG. 4 illustrates a short-to-ground state of the power amplification device according to the first embodiment.

FIG. 4 shows a state (short-to-ground state) in which a short-to-ground resistor Rs is connected, due to erroneous connection, between one output terminal 12-1 of the BTL output and the ground power supply GND.

As shown in FIG. 4, one end of the short-to-ground resistor Rs is connected to the output terminal 12-1, and the other end is connected to the ground power supply GND. As a result, an overcurrent Io(short) flows in the short-to-ground resistor Rs. The overcurrent Io(short) flows through a current path between the source and drain of the output transistor M1. The instantaneous loss power Pd1 in the output transistor M1 at this time is expressed by the following formula (1), supposing that the input signal is zero:

$$Pd1 = \left(\frac{Vcc}{2}\right)^2 / Rs \quad (1)$$

Subsequently, the comparator C1 detects this short-to-ground state. If a power that is input to the comparator C1 is Pin(COMP) and a determination reference power of the comparator C1 is Pref(COMP), a formula for determining the short-to-ground state is expressed by the following formula (2):

(determining formula for short-to-ground state)

$$Pin(COMP) > Pref(COMP) \quad (2)$$

where Pin(COMP)=Pm1−Pm4 (Pm1 and Pm4 are outputs from the power detection circuits D1 and D4).

As described above, the comparator C1 determines the short-to-ground state if the determination formula (2) is established.

Further, in the short-to-ground state shown in FIG. 4, from the relationship, output Pm1>>output Pm4, the following formula is obtained:

$$Pm1 > Pref(COMP) \quad (3)$$

The instantaneous loss power Pd1, which is consumed in the output transistor M1, is monitored in the output of the power detection circuit D1. If the power ratio of the instantaneous loss power Pd1 is 1/m, and a monitor error is considered, the following formula (4) is obtained:

$$Pm1 = \frac{Pd1}{m}\left(1 + \frac{\Delta Pd1}{Pd1}\right) \quad (4)$$

When the monitor error ΔPd/Pd1=0 is supposed, the Pref (COMP) for detecting the short-to-ground by the short-to-ground resistor Rs is expressed by the following formula (5), using the above formulae (1), (3) and (4):

$$Pref(COMP) = \frac{Vcc^2}{4 \cdot m \cdot Rs} \quad (5)$$

<Driving Operation (BTL Load Driving State)>

Next, referring to FIG. 5, the driving operation in the BTL load driving state is described. FIG. 5 shows the state (BTL load driving state) in which a load resistor RL of the speaker 13 is connected to both output terminals 12-1 and 12-2 of the BTL output. This load driving state is a normal driving operation, without erroneous connection.

What is important at the time of short-to-ground detection is to avoid erroneous detection of short-to-ground, that is, erroneous diagnosis, when the load connection (BTL) is normal. By the restrictions for ensuring this, a minimum resistance value of the short-to-ground resistor Rs, which can be detected by the power amplification device 10 of this embodiment, can be found. This resistance value is calculated below.

In the BTL load driving state shown in FIG. 5, at the phase φ1 of the signal, the current flowing in the output transistor M1 is equal to the current flowing in the output transistor M4. Similarly, at the phase φ2 of the signal, the current flowing in the output transistor M2 is equal to the current flowing in the output transistor M3.

Supposing that the output midpoint voltage in the no-signal state is Vcc/2 that is half the internal power supply voltage Vcc, as described above, the instantaneous loss power Pd1 occurring in the output transistor M1 is equal to the instantaneous loss power Pd4 occurring in the output transistor M4 in the case of the phase φ1. The output midpoint voltage detection circuit 55 determines whether this supposition is established or not, and outputs the detection result to the comparator C1, C2. For example, if the output midpoint voltage greatly deviates from the predetermined Vcc/2, the comparator C1, C2 is controlled so as not to erroneously determine short-to-supply or short-to-ground.

The output Pm1 of the power detection circuit D1 and the output Pm4 of the power detection circuit D4 are expressed by the following equation (6), and the output Pd1=Pd4:

$$Pm1 = \frac{Pd1}{m}\left(1 + \frac{\Delta Pd1}{Pd1}\right) \quad (6)$$

$$Pm4 = \frac{Pd4}{m}\left(1 + \frac{\Delta Pd4}{Pd4}\right)$$

The power monitor error term (ΔPd1/Pd1−ΔPd4/Pd4) occurs at random due to an IC fabrication process, etc.

At the time of the BTL load driving shown in FIG. 5, the instantaneous maximum loss power Pd1max(BTL), Pd4max (BTL) occurs when the BTL output amplitude is Vcc/2, and is expressed by the following equation:

$$Pd1\max(BTL) = Pd4\max(BTL) = \frac{Vcc^2}{8RL} \quad (7)$$

At this time, the monitor power Pinmax(COMP) that is input to the comparator C1 is expressed by the following equation (8):

$$Pin\max(COMP) = Pm1\max - Pm4\max \quad (8)$$

$$= \frac{Pd1\max}{m}\left(\frac{\Delta Pd1}{Pd1} - \frac{\Delta Pd4}{Pd4}\right)$$

$$= \frac{Vcc^2}{8m \cdot RL}\left(\frac{\Delta Pd1}{Pd1} - \frac{\Delta Pd4}{Pd4}\right)$$

In order to prevent erroneous determination of short-to-ground connection at the time of the BTL load driving, it is imperative that the monitor power Pinmax(COMP) in the equation (8) be not higher than Pref(COMP) in the above equation (5).

In other words, the "condition for preventing erroneous determination of short-to-ground connection at the time of the BTL load driving" is expressed by the following formula (9):

$$Pin\max(COMP) < P\text{ref}(COMP) \quad (9)$$

If the equations (5) and (8) are substituted in the formula (9), the "minimum resistance value of the short-to-ground resistor Rs which can be determined" in the case of the present embodiment is found, and is expressed by the following formula (10):

$$\therefore Rs < \frac{2 \cdot RL}{\left(\frac{\Delta Pd1}{Pd1} - \frac{\Delta Pd4}{Pd4}\right)} \quad (10)$$

According to the formula (10), the resistance value of the short-to-ground resistor Rs which can be determined becomes smaller as the power monitor error term ($\Delta Pd1/Pd1 - \Delta Pd4/Pd4$) becomes greater and as the BTL driving load resistance (RL) becomes smaller. In short, the short-to-ground detection sensitivity decreases.

For example, assume the case in which the resistance value of the load resistor RL is 2Ω and the short-to-ground resistance Rs less than 4Ω (Rs<4Ω) is to be detected. In this case, it is understood that it should suffice if the sum of the power monitor error term is set within 100%. Thus, the detection sensitivity at the time of erroneous connection can be maximized.

This means that in the case where $\Delta Pd1/Pd1$ and $\Delta Pd4/Pd4$ are equal, it should suffice if an error of each value falls within 50%. In the case of a power amplifier IC that handles high power, the current that flows is large (e.g. several ampere) and the power monitor ratio m needs to be increased to several hundreds to several thousands. However, it is not so difficult to reduce and control the setting of the monitor error term to this level. As described above, according to this embodiment, if the error term can be controlled within 50%, it is possible to satisfy both the heavy load driving of RL=2Ω and the short-to-ground detection sensitivity of Rs<4Ω. Formally, the tolerable error term can be increased about four times, compared to a comparative example that is described later.

In other words, according to the device 10 of this embodiment, even when the monitor error term in the IC fabrication process is taken into account, the detectable resistance value of the short-to-ground resistor Rs can be decreased, and the short-to-ground detection sensitivity can advantageously be enhanced.

Moreover, in order to enhance the detection sensitivity, the BTL driving load RL is not increased unnecessarily. In other words, the restriction to the magnitude of the drivable load can be reduced, and the performance for driving the BTL load can be maximized.

In the above description, the case in which short-to-ground occurs at the output terminal 12-1 has been described by way of example. The same applies to the case in which short-to-ground occurs at the output terminal 12-2. Namely, the comparator C2, which compares the instantaneous loss powers Pd2 and Pd3 of the output transistors M2 and M3, operates like the comparator C1. Thus, a detailed description of this case is omitted here.

Even in the state (short-to-supply state) in which the output terminal 12-1 or output terminal 12-2 is short-circuited to the internal power supply Vcc, if the comparators C1 and C2 are configured as comparators for short-to-supply, the same advantageous effects can be obtained. Specifically, in the case of the comparators for short-to-supply, it should suffice if the determination by the comparator C1 and comparator C2 is altered to Pin(COMP)=Pm4−Pm1, if a description is given by using the formula (2). Thus, a detailed description of the short-to-supply state is omitted here.

According to the power amplification device of this embodiment, at least the following advantageous effects (1) to (3) can be obtained.

(1) The detection sensitivity and load driving performance at the time of erroneous connection can be maximized.

(1)-1

As has been described above, the power amplification device 10 includes the power detection circuits D1 to D4 which detect the powers of the output transistors M1 to M4.

Whether the output transistor, M1 to M4, is destroyed or not is determined by whether a heat amount [heat W=power P=current I×voltage V], which is produced in the output transistor, M1 to M4, exceeds a predetermined tolerance value or not. In the conventional protection means, however, a current flowing in the output transistor is let to flow through a current-mirrored detection transistor, and the current is directly monitored, detected and compared. Thus, the conventional protection means is configured to detect only the current I among the factors that determine the heat amount. This being the case, only ambiguous determination can be made as to whether the output transistor is destroyed or not.

On the other hand, in the power amplification device 10 according to the present embodiment, the powers of the output transistors M1 to M4 can be detected by the power detection circuits D1 to D4. Thus, both factors, current I and voltage V, which determine the heat amount, can be detected, and the heat amount can be detected on the basis of the essential factors of the same order. Therefore, the detection sensitivity and load driving performance at the time of erroneous connection can be maximized.

For example, as indicated the formula (10), even in the case where the resistance value of the load resistor RL is 2Ω and the short-to-ground resistance Rs less than 4Ω (Rs<4Ω) is to be detected, it is understood that it should suffice if the sum of the power monitor error term is set within 100%. Thus, the detection sensitivity at the time of erroneous connection can be maximized, and the load driving performance can be maximized.

(1)-2

In addition, the power amplification device 10 according to the present embodiment includes the comparator C1 which compares the outputs of the power detection circuits D1 and D4, and the comparator C2 which compares the outputs of the power detection circuits D2 and D3. Thus, compared to the structure shown in FIG. 6 which will be described later, the detection sensitivity at the time of erroneous connection can further be enhanced, and the detection sensitivity at the time of erroneous connection can be maximized.

Figure 6:
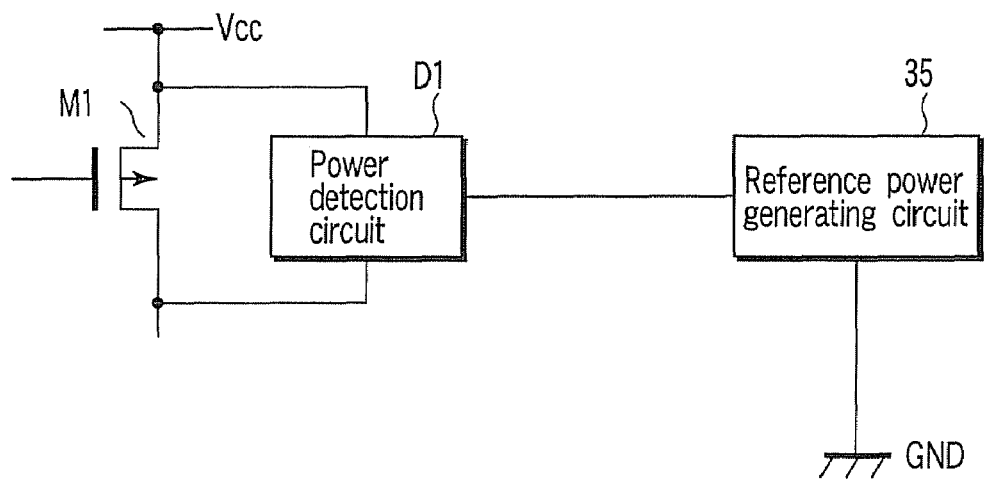
FIG. 6 is a block diagram for explaining an advantageous effect of the power amplification device according to the first embodiment.
Figure 7:
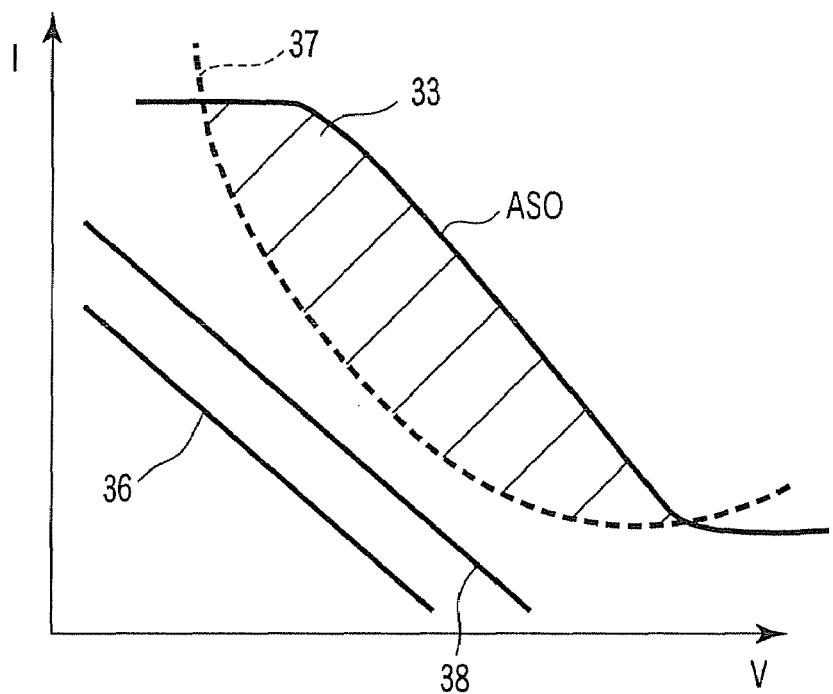
FIG. 7 shows an ASO curve of an output transistor in the first embodiment.

This point is explained with reference to FIG. 6 and FIG. 7. FIG. 6 is a block diagram for explaining an advantageous effect of the power amplification device according to the first embodiment. FIG. 7 shows an ASO curve, a protection sensitivity curve and drive curves of the output transistor M1 in this embodiment.

For example, as shown in FIG. 6, it is thinkable that the output from the power detection circuit D1 may be compared with a reference power that is generated from a reference power generating circuit 35, without using the comparator C1, C2. In FIG. 7, a drive curve 36 indicates a driving power necessary for the output transistor M1 at the time of the BTL load driving state. A protection sensitivity curve 37 is a sensitivity curve which is defined by the reference power generating circuit 35. A drive curve 38 is an abnormal drive curve in a case of a short-to-ground state due to some short-to-ground resistance Rs, aside from the BTL driving state.

Thus, in the structure of FIG. 6, a region is present between the drive curve 36 and sensitivity curve 37, and no protection is executed at operation points of the erroneous connection state, which fall within this region. For example, assume the case in which the drive curve 38 is a drive curve in an erroneous connection state at the time when the BTL load RL is driven in the state in which the output terminal is shorted to the ground by the short-to-ground resistor Rs. In this case, since the drive curve 38 does not exceed the sensitivity curve 37, "short-to-ground" is not determined and no protection is effected.

On the other hand, in the power amplification device 10 according to the present embodiment, the outputs of the power detection circuits D1 to D4 are compared by the comparators C1 and C2. Thus, the occurrence of imbalance between the drive curve relating to the transistor M1 and the drive curve relating to the transistor M4 can be detected. If only the output terminal 12-1 is shorted to ground and the output terminal 12-2 is not shorted to ground, "short-to-ground" can be determined since the drive curve 38 in the erroneous connection state relating to the transistor M1 exceeds the drive curve 36 relating to the transistor M4. Therefore, the detection sensitivity and the load driving performance at the time of erroneous connection can be maximized.

As described in (1)-1 and (1)-2, according to the power amplification device 10 of the present embodiment, the detection sensitivity for output erroneous connection and the load driving performance, between which there is a certain trade-off, can be maximized.

(2) The chip size can advantageously be reduced.

Further, in the power amplification device 10 of this embodiment, as described above, the tolerance error of the power monitor error is large, and the power ratio (1:m) between the output transistor, M1 to M4, and the power detection circuit, D1 to D4, can be set at a high value. In general, to set this power ratio at a high value leads to an increase in power monitor error. However, in the present embodiment, since the tolerance error is large, the power ratio can be set at a high value.

As a result, since the area of occupation by current-mirror transistors M11 and M22 in the power detection circuits D1 to D4, which will be described later in connection with Examples 1 and 2, can be decreased, the chip size can advantageously be reduced.

(3) The reliability can be enhanced.

Further, the power amplification device 10 includes the output midpoint voltage detection circuit 55 which detects the output midpoint voltage of the output terminal 12-1, 12-2 and outputs the detection result to the comparator C1, C2.

Thus, the output midpoint voltage of the output terminal 12-1, 12-2 can be detected. As a result, the logical product between the comparison result of the power detection circuits, D1 to D4, and the output of the output midpoint voltage detection circuit 55 is output to the comparator output terminal 19-1, 19-2 of the comparator C1, C2, and erroneous connection can exactly be determined. Therefore, the reliability of the power amplification device 10 can be enhanced.

As described above, although the logical product between the comparison result of the power detection circuits, D1 to D4, and the output of the output midpoint voltage detection circuit 55 is output to the comparator output terminal 19-1, 19-2, this output can freely be used on the user side.

For example, the amplification circuit 15-1, 15-2 may be turned off by a predetermined circuit that is connected to the comparator output terminal 19-1, 19-2, the sound volume of the speaker 13 may be adjusted in accordance with the output, or the output may directly be output and may simply be reported to the user.

In the present embodiment, the output midpoint voltage detection circuit 55 is included. However, the output midpoint voltage detection circuit 55 is not an indispensable component. The above-described advantageous effects (1) and (2) can be obtained even with the structure that does not include the output midpoint voltage detection circuit 55.

EXAMPLE 1

An Example of the Power Detection Circuit

Next, a power amplification device according to Example 1 is described with reference to FIG. 8. Example 1 relates to an example of the power detection circuit D1. A detailed description of the parts common to those in the first embodiment is omitted here.

Figure 8:
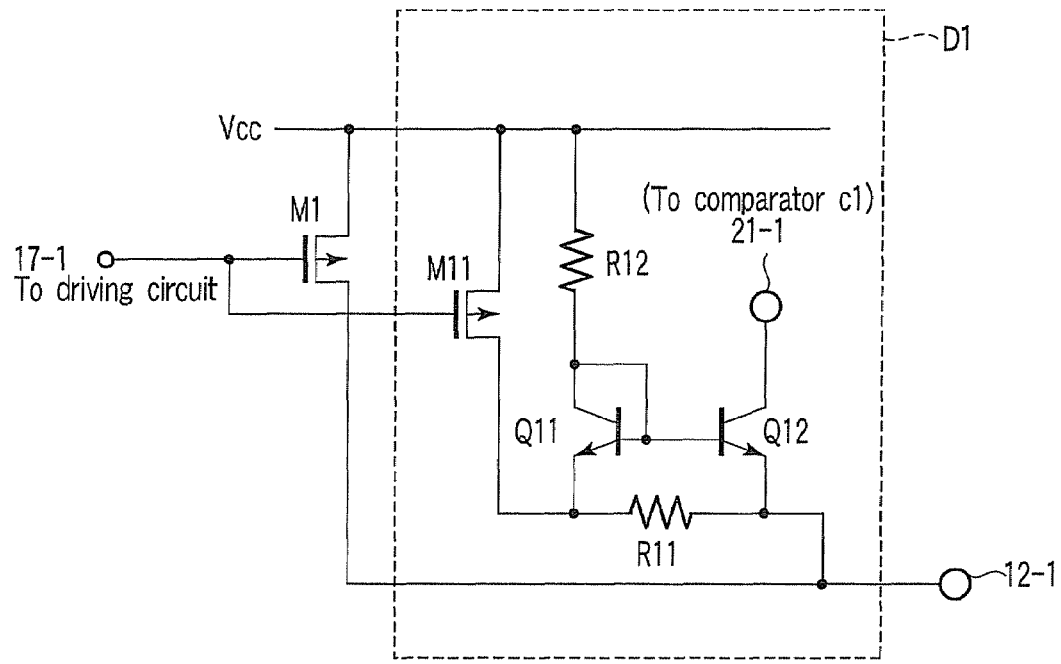
FIG. 8 is a circuit diagram showing an example of a power detection circuit of a power amplification device according to Example 1.

As shown in FIG. 8, the power detection circuit D1 includes a current-mirror transistor M11, resistors R11 and R12, and bipolar transistors Q11 and Q12 that constitute a current-mirror circuit.

The current-mirror transistor M11 is configured to detect a current of the output transistor M1. The current-mirror transistor M11 is a PMOS transistor having a source connected to the internal power supply Vcc, a drain connected to an emitter of the bipolar transistor Q1, and a gate connected to the gate of the output transistor M1.

One end of the resistor R11 is connected to the emitter of the bipolar transistor Q11, and the other end thereof is connected to an emitter of the bipolar transistor Q12. One end of the resistor R12 is connected to the internal power supply Vcc, and the other end thereof is connected to a collector of the bipolar transistor Q11. The resistor R12 is a resistor for detecting a drain-source voltage of the output transistor M1.

The bipolar transistors Q11 and Q12 are configured as a current-mirror circuit for detecting a voltage between both ends of the resistor R11. The collector and base of the bipolar transistor Q11 are commonly connected to the base of the bipolar transistor Q12.

The collector of the bipolar transistor Q12 is connected to a power detection terminal 21-1, and the emitter of the bipolar transistor Q12 is connected to the output terminal 12-1.

As described above, the current-mirror transistor M11 can detect the current of the output transistor M1, and the resistor R12 can detect the voltage of the output transistor M1. Thus, the power detection circuit D1 is configured to be capable of detecting the output value corresponding to an instantaneous loss power of the output transistor M1.

The power detection circuit D3 in FIG. 1 can similarly be configured as in the present Example 1.

According to the power amplification device of this Example, the same advantageous effects (1) to (3) as described above can be obtained. Further, the power detection circuit D1, D3 can be configured as in this Example, as needed.

EXAMPLE 2

An Example of the Power Detection Circuit

Next, a power amplification device according to Example 2 is described with reference to FIG. 9. Example 2 relates to an example of the power detection circuit D2. A detailed description of the parts common to those in the first embodiment is omitted here.

Figure 9:
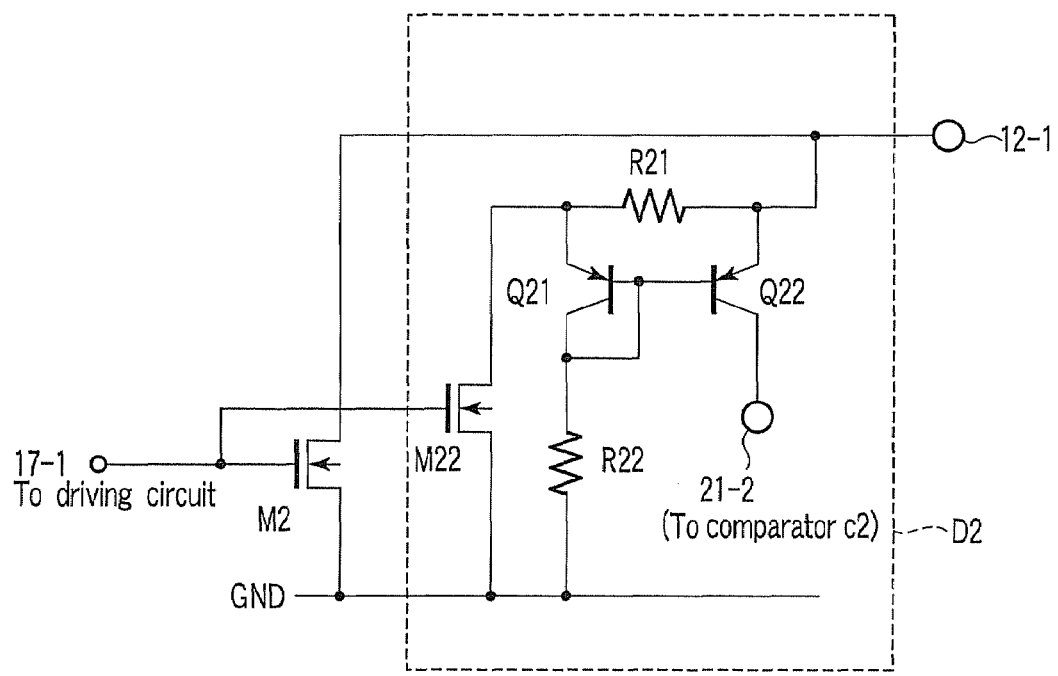
FIG. 9 is a circuit diagram showing an example of a power detection circuit of a power amplification device according to Example 2.

As shown in FIG. 9, the power detection circuit D2 includes a current-mirror transistor M22, resistors R21 and R22, and bipolar transistors Q21 and Q22 that constitute a current-mirror circuit.

The current-mirror transistor M22 is configured to detect a current of the output transistor M2. The current-mirror transistor M22 has a source connected to the ground power supply GND, a drain connected to an emitter of the bipolar transistor Q21, and a gate connected to the gate of the output transistor M2.

One end of the resistor R21 is connected to the emitter of the bipolar transistor Q21, and the other end thereof is connected to an emitter of the bipolar transistor Q22. One end of the resistor R22 is connected to the ground power supply GND, and the other end thereof is connected to a collector of the bipolar transistor Q21. The resistor R22 is a resistor for detecting a drain-source voltage of the output transistor M2.

The bipolar transistors Q21 and Q22 are configured as a current-mirror circuit for detecting a voltage between both ends of the resistor R21. The collector and base of the bipolar transistor Q21 are commonly connected to the base of the bipolar transistor Q22.

The collector of the bipolar transistor Q22 is connected to a power detection terminal 21-2, and the emitter of the bipolar transistor Q22 is connected to the output terminal 12-1.

As described above, the current-mirror transistor M22 can detect the current of the output transistor M2, and the resistor R22 can detect the voltage of the output transistor M2. Thus, the power detection circuit D2 is configured to be capable of detecting the output value corresponding to an instantaneous loss power of the output transistor M2.

The power detection circuit D4 in FIG. 1 can similarly be configured as in the present Example 2.

According to the power amplification device of this Example, the same advantageous effects (1) to (3) as described above can be obtained. Further, the power detection circuit D2, D4 can be configured as in this Example, as needed.

EXAMPLE 3

An Example of the Comparator

Next, a power amplification device according to Example 3 is described with reference to FIG. 10. Example 3 relates to an example of the comparator C1. A detailed description of the parts common to those in the first embodiment is omitted here.

Figure 10:
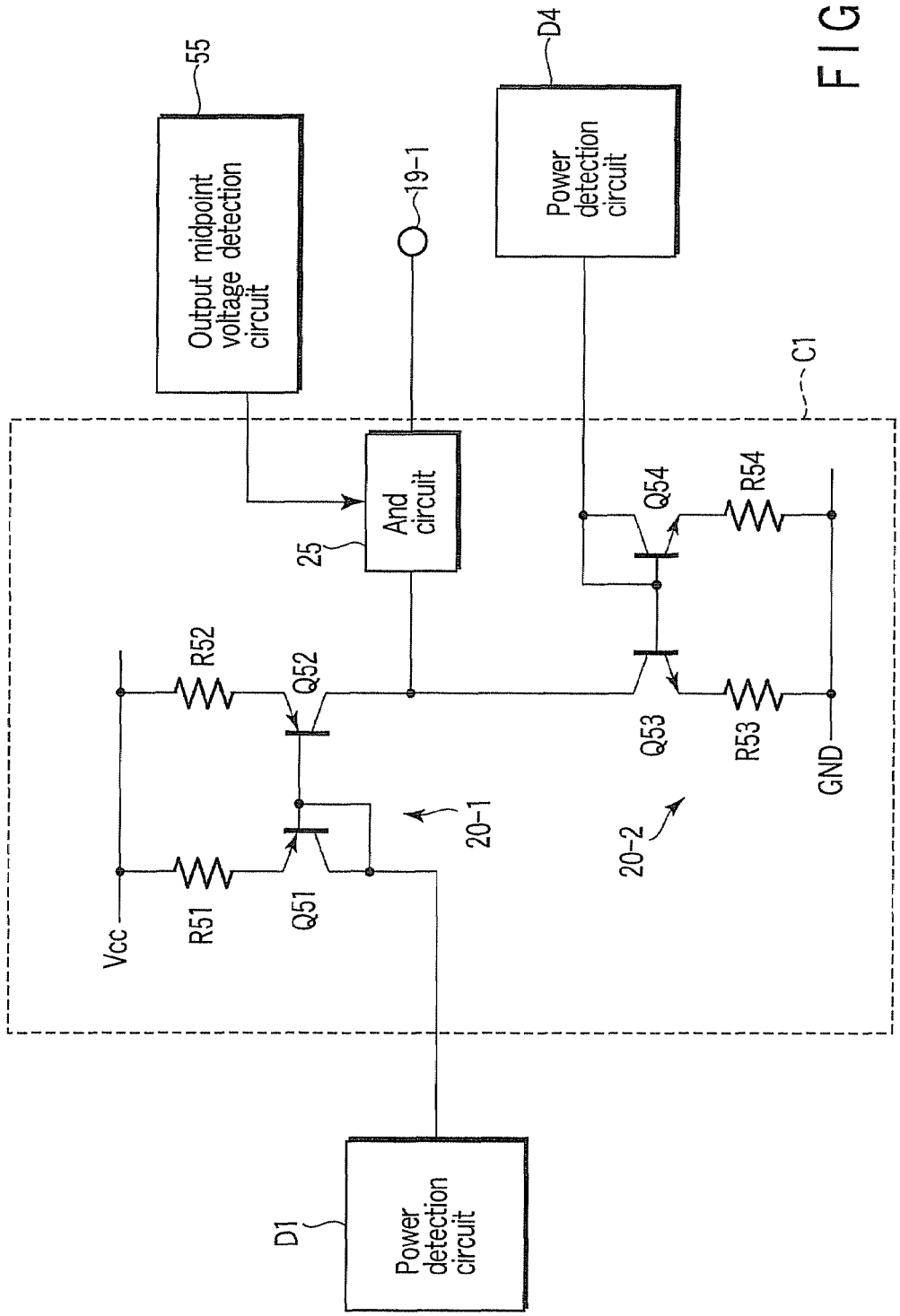
FIG. 10 is a circuit diagram showing an example of a comparator of a power amplification device according to Example 3.

As shown in FIG. 10, the comparator C1 includes current-mirror circuits 20-1 and 20-2 functioning as a current comparator circuit, and an AND circuit 25.

The current-mirror circuit 20-1 is configured to receive, at its input, an output current from the power detection circuit D1, to current-mirror the received output current, to compare the output current with an output current from the current-mirror circuit 20-2, and to output a logical result of the comparison to the AND circuit 25. The current-mirror circuit 20-1 includes bipolar transistors Q51 and Q52, and resistors R51 and R52.

The collector and base of the bipolar transistor Q51 are connected to the output of the power output circuit D1, and the emitter of the bipolar transistor Q51 is connected to one end of the resistor R51. The collector of the bipolar transistor Q52 is connected to an input of the AND circuit 25, the emitter of the bipolar transistor Q52 is connected to one end of the resistor R52, and the base of the bipolar transistor Q52 is connected to the base of the bipolar transistor Q51.

The other ends of the resistors R51 and R52 are connected to the internal power supply Vcc.

The current-mirror circuit 20-2 is configured to receive, at its input, an output current from the power detection circuit D4, to current-mirror the received output current, to compare the output current with an output current from the current-mirror circuit 20-1, and to output a logical result of the comparison to the AND circuit 25. The current-mirror circuit 20-2 includes bipolar transistors Q53 and Q54, and resistors R53 and R54.

The emitter of the bipolar transistor Q53 is connected to one end of the resistor R53, the collector of the bipolar transistor Q53 is connected to the input of the AND circuit 25, and the base of the bipolar transistor Q53 is connected to the base and collector of the bipolar transistor Q54. The collector and base of the bipolar transistor Q54 are connected to the output of the power output circuit D4, and the emitter of the bipolar transistor Q54 is connected to one end of the resistor R54.

The other ends of the resistors R53 and R54 are connected to the ground power supply GND.

As described above, the connection node between the collectors of the bipolar transistors Q52 and Q53 is a current comparison terminal for comparison between the output current of the power detection circuit D1 and the output current of the power detection circuit D4.

The AND circuit 25 is configured to receive, at its inputs, an output logical value of the current comparator of the current mirror circuits 20-1 and 20-2 and an output logical value of the output midpoint voltage detection circuit 55, to calculate a logical product of these values, and to output the logical product to the comparator output terminal 19-1.

In this manner, the comparator C1 is configured to output the logical product between the output current comparison result of the power detection circuit D1 and D4 and the output of the output midpoint voltage detection circuit 55.

In this Example, an example of the comparator for short-to-ground is shown. However, the setting in the comparator may be altered so as to be applicable to another kind of comparator for short-to-ground, or a comparator for short-to-supply.

For example, in the case of the comparator for short-to-ground, it is desirable that the ratio in size between the bipolar transistors Q51 and Q52 be set at 1:1, and the ratio in size between the bipolar transistors Q53 and Q54 be set at n:1 (n>1). In the short-to-ground state, since it should suffice to adopt the structure for detecting that the magnitude of the output current of the circuit D1 exceeds the magnitude of the output current of the circuit D4, the value of n may properly be selected. On the other hand, for example, in the case of the comparator for short-to-supply, it is desirable that the ratio in size between the bipolar transistors Q51 and Q52 be set at 1:n (n>1), and the ratio in size between the bipolar transistors Q53 and Q54 be set at 1:1. In the short-to-supply state, since it should suffice to adopt the structure for detecting that the magnitude of the output current of the circuit D4 exceeds the magnitude of the output current of the circuit D1, the value of n may properly be selected. As regards the comparator C2 in FIG. 1, the same structure as in this Example may be adopted.

According to the power amplification device of this Example, the same advantageous effects (1) to (3) as described above can be obtained. Further, the comparator C1, C2 can be configured as in this Example, as needed.

EXAMPLE 4

An Example of the Output Midpoint Voltage Detection Circuit

Next, a power amplification device according to Example 4 is described with reference to FIG. 11. Example 4 relates to an example of the output midpoint voltage detection circuit 55. A detailed description of the parts common to those in the first embodiment is omitted here.

Figure 11:
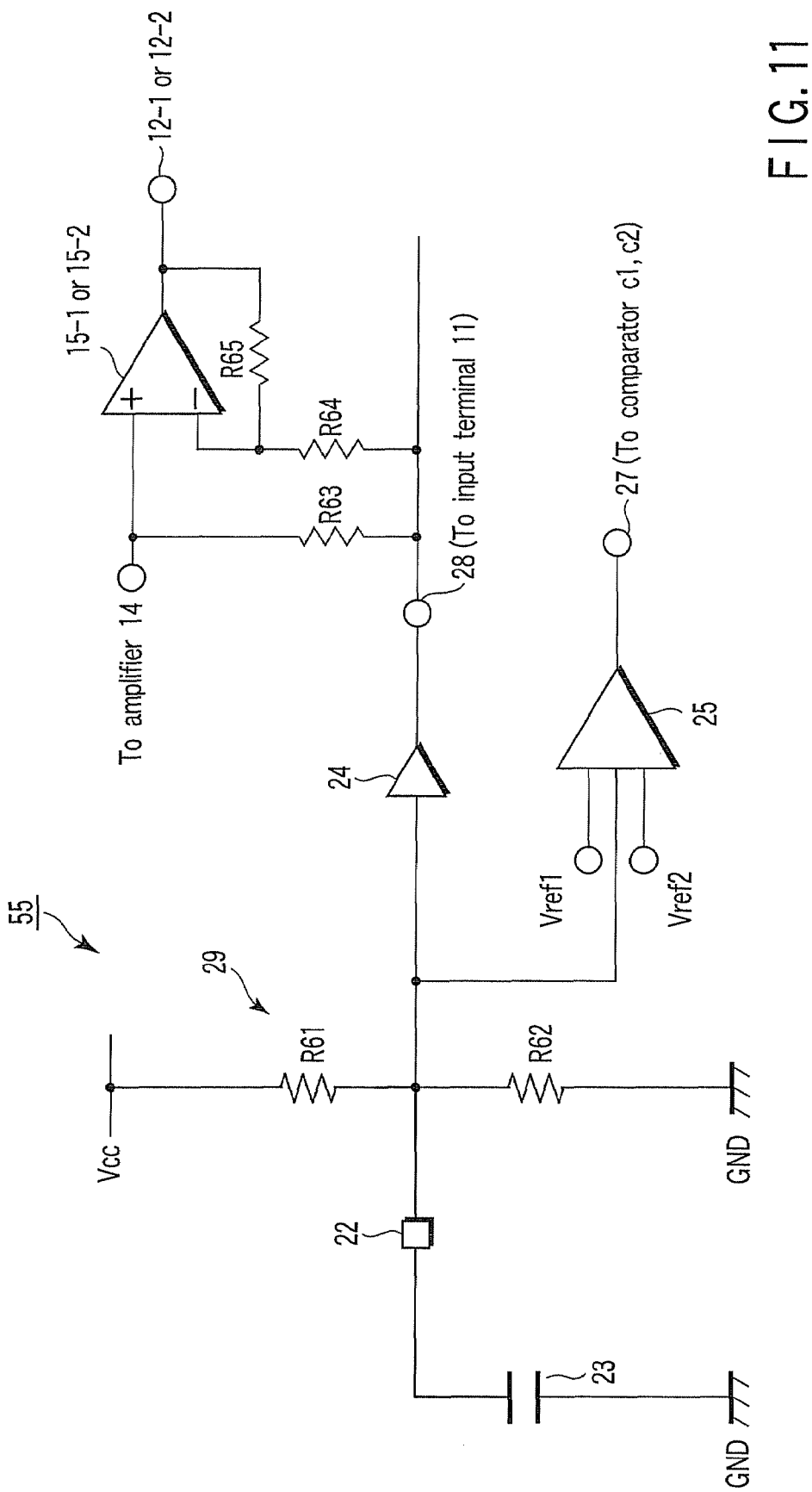
FIG. 11 is a circuit diagram showing an example of an output midpoint voltage detection circuit of a power amplification device according to Example 4.

As shown in FIG. 11, the output midpoint voltage detection circuit 55 is configured to determine whether a voltage at a ripple terminal 22, which is an input terminal of a buffer amplifier 24 for determining the DC voltage at the output terminal 12-1, 12-2 of the power amplification device 10, is within the range of between predetermined reference voltages Vref1 and Vref2, and to output the determination result to the comparator C1, C2 from an output midpoint voltage detection terminal 27. Normally, a ripple capacitor 23 at an outside of the IC is connected to the ripple terminal 22, thereby to increase a power supply variation elimination ratio at the output terminal 12-1, 12-2 of the power amplification device 10.

In addition, an output midpoint voltage generating circuit 29 is configured to amplify a ripple terminal voltage 22 by the buffer amplifier 24, and to output the amplified voltage to a feedback resistor R64 and an input resistor R63 of the power amplifier device 10 from a power amplifier output midpoint determination terminal 28. The input resistor R63 and feedback resistors R64 and R65 are provided between the power amplifier output midpoint determination terminal 28 and the power amplification device 10.

The output midpoint voltage detection circuit 55 includes the ripple capacitor 23, output midpoint voltage generating circuit 29, buffer amplifier 24 and window comparator 25.

One of the electrodes of the ripple capacitor 23 is connected to the ground power supply GND, and the other electrode is connected to the ripple terminal 22.

The output midpoint voltage generating circuit 29 is configured to determine the output midpoint voltage (Vcc/2 in this Example), and includes resistors R61 and R62. In the case where the output midpoint voltage is set at Vcc/2, as in this Example, the ratio between the resistance values of the resistors R61 and R62 is set at 1:1.

One end of the resistor R61 is connected to the internal power supply Vcc, and the other end is connected to the ripple terminal 22. One end of the resistor R62 is connected to the ground power supply GND, and the other end thereof is connected to the ripple terminal 22. In this manner, the connection node between the resistors R61 and R62 constitutes the ripple terminal 22.

The buffer amplifier 24 is configured to amplify the output midpoint voltage and to output the amplified voltage to the feedback resistor R64 and input resistor R63 of the power amplifier device 10 via the power amplifier output midpoint determination terminal 28.

The window comparator 25 is configured to monitor as to whether the voltage (midpoint voltage) at the connection node of the resistors R61 and R62 falls within the range of between the reference voltages Vref1 and Vref2. The window comparator 25 outputs the monitor result to the output midpoint voltage detection terminal 27 that is connected to the comparator C1, C2 (AND circuit 25). The reference voltages Vref1 and Vref2 are set at, e.g. Vref1=Vcc/2+α and Vref2=Vcc/2−α (α is an arbitrary constant). For example, if the voltage (midpoint voltage) at the connection node of the resistors R61 and R62 falls within this range, the window comparator 25 is set to output a logical value "1", and the value "1" is input to the AND circuit 25 shown in FIG. 10. Thereby, the detection of the erroneous connection state can more exactly be performed.

According to the power amplification device of this Example, the same advantageous effects (1) to (3) as described above can be obtained. Further, the output midpoint voltage detection circuit 55 may be configured as in this Example, as needed.

Second Embodiment

An Example Including Comparators for Short-to-Ground and Comparators for Short-to-Supply Next, a power amplification device according to a second embodiment of the invention is described with reference to FIG. 12. The second embodiment relates to an example including comparators C1 and C2 for short-to-ground and comparators C3 and C4 for short-to-supply. A detailed description of the parts common to those in the first embodiment is omitted here.

Figure 12:
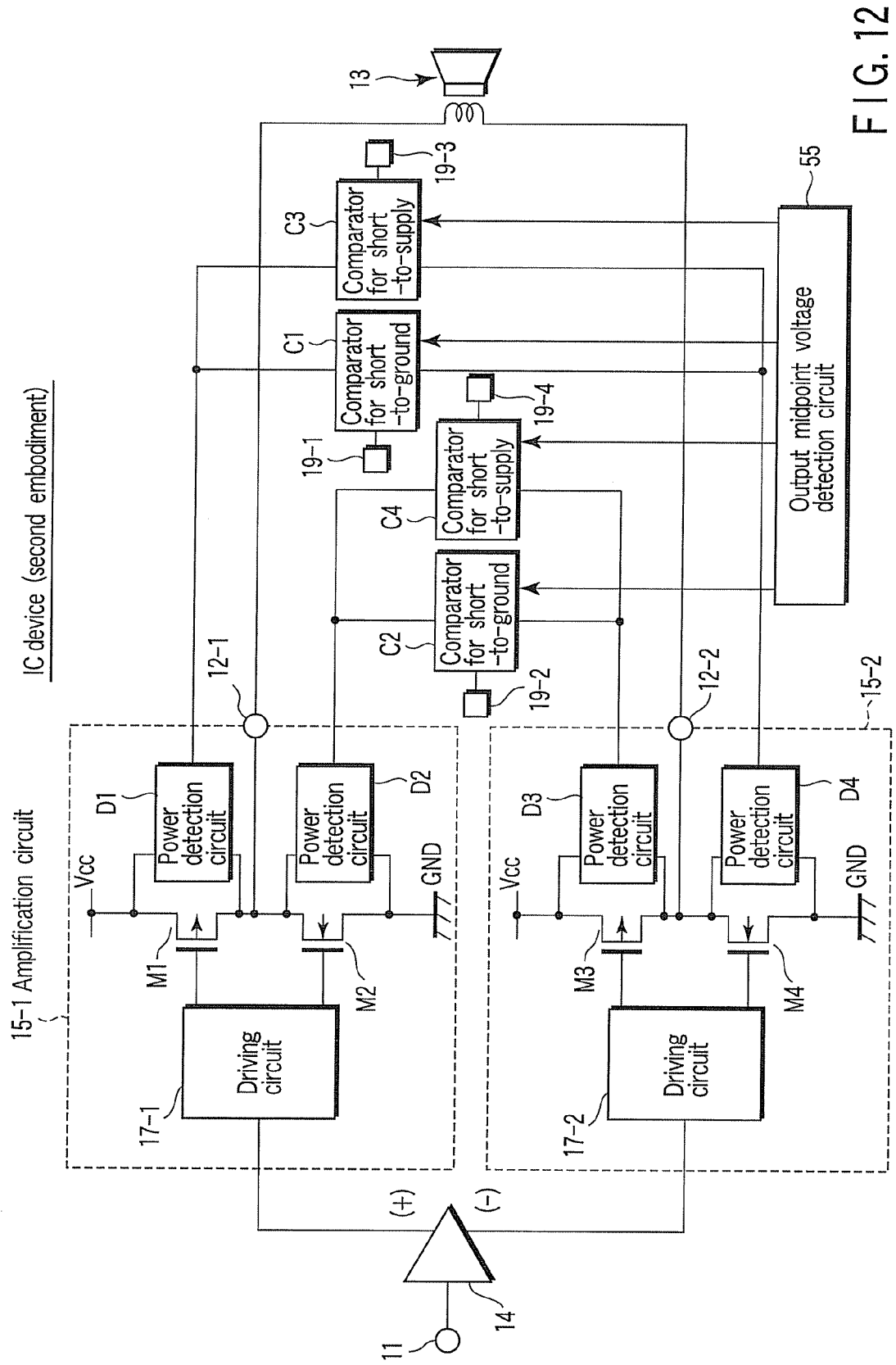
FIG. 12 is a block diagram showing a power amplification device according to a second embodiment of the present invention.

As shown in FIG. 12, the power amplification device according to this embodiment differs from that of the first embodiment in that the power amplification device further includes comparators C3 and C4 for short-to-supply.

Like the first embodiment, the output of the output midpoint voltage detection circuit 55 is input to the comparator C3, C4 for short-to-supply. An AND circuit (not shown) in the comparator C3, C4 calculates a logical product, and outputs it to a comparator output terminal 19-3, 19-4.

A detailed description of the comparator C3, C4 for short-to-supply is omitted since the comparator C3, C4 for short-to-supply is similar to the comparator C1, C2 for short-to-ground in the above-described Example 3. For example, in the case of the comparator for short-to-supply, as described above, it is desirable that the ratio in size between the bipolar transistors Q51 and Q52 be set at 1:n (n>1), and the ratio in size between the bipolar transistors Q53 and Q54 be set at 1:1.

According to the power amplification device of this Example, the same advantageous effects (1) to (3) as described above can be obtained.

Further, the power amplification device according to this embodiment further includes the comparators C3 and C4 for short-to-supply. Therefore, advantageously, short-to-supply due to erroneous connection can also be detected.

COMPARATIVE EXAMPLE

Next, a power amplification device according to a comparative example is described with reference to FIG. 13, for comparison with the power amplification device 10 according to the first embodiment. In this comparative example, the short-to-ground state of the output transistor is detected by a current that is current-mirrored in a detection transistor. A detailed description of the parts common to those in the first embodiment is omitted here.

As shown in FIG. 13, a BTL output is produced by a first amplification circuit 150-1 having output transistors Q1 and Q2 as a push-pull output, and a second amplification circuit 150-2 having output transistors Q3 and Q4 as a push-pull output. The amplification circuits 150-1 and 150-2 include detection transistors Q11 to Q44 for monitoring currents flowing in the output transistors Q1 to Q4.

The comparative example differs from the first embodiment in that the output transistors Q1 to Q4 and detection transistors Q11 to Q44 are composed of bipolar transistors, and the overload states of the output transistors Q1 to Q4 are detected only by currents flowing in the detection transistors Q11 to Q44.

Further, the comparative example includes a comparator C10 which compares the sum of a current of the detection transistor Q11 and a current of the detection circuit Q33 and the sum of a current of the detection transistor Q22 and a current of the detection circuit Q44.

The output of the comparator C10 is connected to control terminals of driving circuits 170-1 and 170-2 which drive the first amplification circuit 150-1 and second amplification circuit 150-2.

<Driving Operation (Short-to-Ground State)>

Next, the driving operation in the short-to-ground state in this comparative example is described.

A description is given of an example of a state (short-to-ground state) in which a short-to-ground resistor Rs is connected, due to erroneous connection, between one output terminal 112-1 of the BTL output and the ground power supply GND in FIG. 13.

In this case, a current, which flows to the short-to-ground resistor Rs, flows through a current path of the output transistor Q1. The current value Io(short) at this time is expressed by the following formula (11), supposing that the input signal is zero and the output midpoint voltage is Vcc/2:

$$Io(\text{short}) = Vcc/(2Rs) \tag{11}$$

On the other hand, the comparator C10 in FIG. 13 functions to detect this short-to-ground state. Thus, if the current that is input to the comparator C10 is Iin(COMP) and the reference current of the comparator C10 is Iref(COMP), the determination formula for the short-to-ground state is expressed by the following formula (12). If the formula (12) is established, the comparator C10 determines the short-to-ground state:

(determining formula for short-to-ground state)

$$Iin(COMP) > Iref(COMP) \tag{12}$$

(where Iin(COMP)=I(Q11)+I(Q22)−I(Q33)−I(Q44))

Further, in the short-to-ground state, from the relationship, output I(Q11)>>I(Q22), I(Q33), I(Q44), the following formula (13) is obtained:

$$I(Q11) > Iref(COMP) \tag{13}$$

Then, the current flowing in the output transistor Q1 is monitored by the current flowing in the detection transistor Q11. Thus, if the current ratio is 1/m and a current mirror error is considered, the current flowing in the detection transistor Q11 is expressed by the following formula (14):

$$I(Q11) = \frac{I(Q1)}{m}\left(1 + \frac{\Delta I(Q1)}{I(Q1)}\right) \tag{14}$$

When the current mirror error ΔI(Q1)/I(Q1)=0 is supposed, the Iref(COMP) for detecting the short-to-ground by the short-to-ground resistor Rs is expressed by the following formula (15), using the above formulae (11), (13) and (14):

$$Iref(COMP) = \frac{Vcc}{2 \cdot m \cdot Rs} \tag{15}$$

What is important for the short-to-ground detection is to avoid erroneous detection of short-to-ground, that is, erroneous diagnosis, when the load connection (BTL) is normal. By the restrictions for ensuring this, a minimum resistance value of the short-to-ground resistor Rs, which can be detected by the power amplification device of this comparative example, can be found. The minimum resistance value of the short-to-ground resistor Rs, which prevents the erroneous diagnosis of the short-to-ground in the BTL load driving state, is calculated.

<Driving Operation (BTL Load Driving State)>

The BTL load driving state is a state (BTL load driving state) in which a load resistor RL of the speaker 13 is connected to both output terminals 112-1 and 112-2 of the BTL output. This load driving state is a normal driving operation, without erroneous connection.

In the BTL load driving state, at the phase φ1 of the signal, the current flowing in the output transistor Q1 is equal to the current flowing in the output transistor Q4 in FIG. 13. On the other hand, at the phase φ2 of the signal, the current flowing in the output transistor Q2 is equal to the current flowing in the output transistor Q3.

If the case of the phase φ1 is considered, the current flowing in the detection transistor Q11 and the current flowing in the detection transistor Q44 are expressed by the following equation (16):

$$I(Q11) = \frac{I(Q1)}{m}\left(1 + \frac{\Delta I(Q1)}{I(Q1)}\right)$$
$$I(Q44) = \frac{I(Q4)}{m}\left(1 + \frac{\Delta I(Q4)}{I(Q4)}\right) \tag{16}$$

The currents flowing in the output transistors Q1 and Q4 are equal, and I(Q1)=I(Q4). In addition, the current mirror error term occurs at random due to the IC fabrication process.

Then, the maximum current Iomax(BTL) at the time of the BTL load driving is expressed by the following equation (17). The residual voltages of the output transistors Q1 to Q4 are ignored.

$$Io\ \max(BTL) = \frac{Vcc}{RL} \quad (17)$$

Then, the current Iin(COMP) that is input to the comparator C10 is substantially I(Q11)-I(Q44), and is expressed by the following formula (18):

$$Iin(COMP) = I(Q11) - I(Q44) \quad (18)$$
$$= \frac{Io\ \max(BTL)}{m}\left(\frac{\Delta I(Q1)}{I(Q1)} - \frac{\Delta I(Q4)}{I(Q4)}\right)$$
$$= \frac{Vcc}{m \cdot RL}\left(\frac{\Delta I(Q1)}{I(Q1)} - \frac{\Delta I(Q4)}{I(Q4)}\right)$$

In order to prevent erroneous determination of short-to-ground at the time of the BTL load driving, it is imperative that the Iin(COMP) in the equation (18) be not higher than Iref(COMP) in the above equation (15). Thus, the "condition for preventing erroneous determination of short-to-ground at the time of the BTL load driving" is expressed by the following formula (19):

$$Iin(COMP) < Iref(COMP) \quad (19)$$

If the equations (15) and (18) are substituted in the formula (19), the "minimum resistance value of the short-to-ground resistor Rs which can be determined by the structure of the comparative example" is found, and is expressed by the following formula (20):

$$\therefore Rs < \frac{RL}{2\left(\frac{\Delta I(Q1)}{I(Q1)} - \frac{\Delta I(Q4)}{I(Q4)}\right)} \quad (20)$$

According to the formula (20), it is understood that the resistance value of the short-to-ground resistor Rs which can be determined becomes smaller as the current mirror error term becomes greater and as the BTL driving load RL becomes smaller. In short, the short-to-ground detection sensitivity decreases.

For example, assume the case in which the driving is executed at the load resistance RL=2Ω and the short-to-ground resistance Rs<4Ω is to be detected. In this case, it is understood that it should suffice if the sum of the current-mirror error term has to be set within 25%. This means that in the case where $\Delta I(Q1)/I(Q1)$ and $\Delta I(Q4)/I(Q4)$ are equal, an error of each value has to be set within an error of 12.5%. Thus, the tolerable error in the comparative example is about ¼, and is smaller than the tolerable error (50%) in the first and second embodiments and Examples 1 to 4. Furthermore, in the case of a power amplifier IC that handles high power, the current that flows is large (e.g. several ampere) and the current-mirror ratio m needs to be increased to several hundreds to several thousands. Thus, it is very difficult to reduce and control the mirror error term to this level. In other words, when the mirror error term in the IC fabrication process is taken into account, the power amplification device according to this comparative example is disadvantageous in decreasing the detectable resistance value of the short-to-ground resistor Rs, that is, in enhancing the short-to-ground detection sensitivity.

Moreover, in order to enhance the detection sensitivity, the resistance value of the BTL driving load RL has to be increased. In other words, the magnitude of the drivable load is restricted, and the performance for driving the BTL load cannot be exhibited to a maximum.

As has been described above, in the power amplification device according to the comparative example, the overload state of the output transistor, Q1 to Q4, is detected by the current that is current-mirrored in the detection transistor, Q11 to Q44. Thus, in the structure of the comparative example, only the current, among the factors that determine the heat amount of the output transistor, Q1 to Q4, is detected. This being the case, ambiguous determination is made as to whether the output transistor is destroyed or not, and the detection error in the determination becomes greater.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A power amplification device comprising:
a BTL amplification circuit including a first amplification circuit and a second amplification circuit, the first amplification circuit including a first output transistor having a current path with one end connected to a first power supply and the other end connected to a first output terminal, a first power detection circuit which detects a power of the first output transistor, a second output transistor having a current path with one end connected to a second power supply and the other end connected to the first output terminal, and a second power detection circuit which detects a power of the second output transistor, the second amplification circuit including a third output transistor having a current path with one end connected to the first power supply and the other end connected to a second output terminal, a third power detection circuit which detects a power of the third output transistor, a fourth output transistor having a current path with one end connected to the second power supply and the other end connected to the second output terminal, and a fourth power detection circuit which detects a power of the fourth output transistor;
a first comparator which compares output values of the first and fourth power detection circuits; and
a second comparator which compares output values of the second and third power detection circuits.

2. The device according to claim 1, further comprising an output midpoint voltage detection circuit which detects each of output voltages of the first and second output terminals in a case where a signal input to the first and second amplification circuits is zero, determines whether the detected output voltage falls within a range of between a first reference voltage and a second reference voltage, and outputs a determination result to each of the first and second comparators.

3. The device according to claim 1, wherein the first power detection circuit comprises:
a detection transistor which detects a current of the first output transistor;
a resistor which detects a voltage across the current path of the first output transistor; and
a current-mirror circuit which obtains an output voltage of a function including a product between an output current of the detection transistor and a current flowing in the resistor.

4. The device according to claim 1, wherein the second power detection circuit comprises:
- a detection transistor which detects a current of the second output transistor;
- a resistor which detects a voltage across the current path of the second output transistor; and
- a current-mirror circuit which obtains an output voltage of a function including a product between an output current of the detection transistor and a current flowing in the resistor.

5. The device according to claim 1, wherein the third power detection circuit comprises:
- a detection transistor which detects a current of the third output transistor;
- a resistor which detects a voltage across the current path of the third output transistor; and
- a current-mirror circuit which obtains an output voltage of a function including a product between an output current of the detection transistor and a current flowing in the resistor.

6. The device according to claim 1, wherein the fourth power detection circuit comprises:
- a detection transistor which detects a current of the fourth output transistor;
- a resistor which detects a voltage across the current path of the fourth output transistor; and
- a current-mirror circuit which obtains an output voltage of a function including a product between an output current of the detection transistor and a current flowing in the resistor.

7. The device according to claim 2, wherein the first comparator comprises:
- a current comparator circuit which compares output currents of the first and fourth power detection circuits; and
- an AND circuit which calculates a logical product between an output logical value of the current comparator circuit and an output logical value of the output midpoint voltage detection circuit.

8. The device according to claim 2, wherein the second comparator comprises:
- a current comparator circuit which compares output currents of the second and third power detection circuits; and
- an AND circuit which calculates a logical product between an output logical value of the current comparator circuit and an output logical value of the output midpoint voltage detection circuit.

9. The device according to claim 2, wherein the output midpoint voltage detection circuit comprises:
- a midpoint voltage generating circuit which generates an intermediate voltage between the first and second power supplies;
- a buffer amplifier which receives an output voltage of the midpoint voltage generating circuit, and amplifies the received voltage; and
- a window comparator which determines whether the output voltage of the midpoint voltage generating circuit falls within the range of between the first reference voltage and the second reference voltage.

10. A power amplification device comprising:
- a BTL amplification circuit including a first amplification circuit and a second amplification circuit, the first amplification circuit including a first output transistor having a current path with one end connected to a first power supply and the other end connected to a first output terminal, a first power detection circuit which detects a power of the first output transistor, a second output transistor having a current path with one end connected to a second power supply and the other end connected to the first output terminal, and a second power detection circuit which detects a power of the second output transistor, the second amplification circuit including a third output transistor having a current path with one end connected to the first power supply and the other end connected to a second output terminal, a third power detection circuit which detects a power of the third output transistor, a fourth output transistor having a current path with one end connected to the second power supply and the other end connected to the second output terminal, and a fourth power detection circuit which detects a power of the fourth output transistor;
- a first comparator for short-to-ground which compares output values of the first and fourth power detection circuits;
- a second comparator for short-to-ground which compares output values of the second and third power detection circuits;
- a first comparator for short-to-supply which compares output values of the first and fourth power detection circuits; and
- a second comparator for short-to-supply which compares output values of the second and third power detection circuits.

11. The device according to claim 10, further comprising an output midpoint voltage detection circuit which detects each of output voltages of the first and second output terminals in a case where a signal input to the first and second amplification circuits is zero, determines whether the detected output voltage falls within a range of between a first reference voltage and a second reference voltage, and outputs a determination result to each of the first and second comparators for short-to-ground and the first and second comparators for short-to-supply.

12. The device according to claim 10, wherein the first power detection circuit comprises:
- a detection transistor which detects a current of the first output transistor;
- a resistor which detects a voltage across the current path of the first output transistor; and
- a current-mirror circuit which obtains an output voltage of a function including a product between an output current of the detection transistor and a current flowing in the resistor.

13. The device according to claim 10, wherein the second power detection circuit comprises:
- a detection transistor which detects a current of the second output transistor;
- a resistor which detects a voltage across the current path of the second output transistor; and
- a current-mirror circuit which obtains an output voltage of a function including a product between an output current of the detection transistor and a current flowing in the resistor.

14. The device according to claim 10, wherein the third power detection circuit comprises:
- a detection transistor which detects a current of the third output transistor;
- a resistor which detects a voltage across the current path of the third output transistor; and
- a current-mirror circuit which obtains an output voltage of a function including a product between an output current of the detection transistor and a current flowing in the resistor.

15. The device according to claim 10, wherein the fourth power detection circuit comprises:
- a detection transistor which detects a current of the fourth output transistor;
- a resistor which detects a voltage across the current path of the fourth output transistor; and
- a current-mirror circuit which obtains an output voltage of a function including a product between an output current of the detection transistor and a current flowing in the resistor.

16. The device according to claim 11, wherein the first comparator for short-to-ground comprises:
- a current comparator circuit which compares output currents of the first and fourth power detection circuits; and
- an AND circuit which calculates a logical product between an output logical value of the current comparator circuit and an output logical value of the output midpoint voltage detection circuit.

17. The device according to claim 11, wherein the second comparator for short-to-ground comprises:
- a current comparator circuit which compares output currents of the second and third power detection circuits; and
- an AND circuit which calculates a logical product between an output logical value of the current comparator circuit and an output logical value of the output midpoint voltage detection circuit.

18. The device according to claim 11, wherein the output midpoint voltage detection circuit comprises:
- a midpoint voltage generating circuit which generates an intermediate voltage between the first and second power supplies;
- a buffer amplifier which receives an output voltage of the midpoint voltage generating circuit, and amplifies the received voltage; and
- a window comparator which determines whether the output voltage of the midpoint voltage generating circuit falls within the range of between the first reference voltage and the second reference voltage.

19. The device according to claim 11, wherein the first comparator for short-to-supply comprises:
- a current comparator circuit which compares output currents of the first and fourth power detection circuits; and
- an AND circuit which calculates a logical product between an output logical value of the current comparator circuit and an output logical value of the output midpoint voltage detection circuit.

20. The device according to claim 11, wherein the second comparator for short-to-supply comprises:
- a current comparator circuit which compares output currents of the second and third power detection circuits; and
- an AND circuit which calculates a logical product between an output logical value of the current comparator circuit and an output logical value of the output midpoint voltage detection circuit.

* * * * *